(12) United States Patent
Voldman

(10) Patent No.: US 8,088,656 B2
(45) Date of Patent: Jan. 3, 2012

(54) FABRICATING ESD DEVICES USING MOSFET AND LDMOS

(75) Inventor: Steven Howard Voldman, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/541,484

(22) Filed: Aug. 14, 2009

(65) Prior Publication Data

US 2011/0039378 A1 Feb. 17, 2011

(51) Int. Cl.
*H01L 21/8238* (2006.01)
*H01L 21/328* (2006.01)

(52) U.S. Cl. .................. 438/200; 257/E21.35
(58) Field of Classification Search .......... 438/200–205, 438/207–208
See application file for complete search history.

(56) References Cited

U.S. PATENT DOCUMENTS

| | | | |
|---|---|---|---|
| 5,346,835 A | 9/1994 | Malhi et al. | |
| 5,578,860 A * | 11/1996 | Costa et al. | 257/528 |
| 5,591,661 A * | 1/1997 | Shiota | 438/200 |
| 6,576,961 B1 * | 6/2003 | Gupta | 257/360 |
| 6,855,985 B2 | 2/2005 | Williams et al. | |
| 7,125,777 B2 | 10/2006 | Cai et al. | |
| 7,211,863 B2 | 5/2007 | Williams et al. | |
| 7,220,633 B2 | 5/2007 | You et al. | |
| 7,718,494 B2 * | 5/2010 | Tsai et al. | 438/275 |
| 2004/0251492 A1 | 12/2004 | Lin | |
| 2005/0148124 A1 * | 7/2005 | Cai et al. | 438/174 |
| 2005/0242399 A1 * | 11/2005 | Huang | 257/355 |
| 2006/0197149 A1 | 9/2006 | Fujimoto | |
| 2006/0286735 A1 | 12/2006 | Wu et al. | |
| 2007/0207600 A1 * | 9/2007 | You et al. | 438/527 |

* cited by examiner

*Primary Examiner* — Savitri Mulpuri
*Assistant Examiner* — Calvin Choi
(74) *Attorney, Agent, or Firm* — Schmeiser, Olsen & Watts; Anthony Canale

(57) ABSTRACT

A method, including; simultaneously forming a first doped region of an electrostatic discharge protection device and a second doped region of a high-power device by performing a first ion implantation into a semiconductor substrate; and simultaneously forming a third doped region of the electrostatic discharge protection device and a fourth doped region of a first low power device by performing a second ion implantation into the semiconductor substrate, the first ion implantation different from the second ion implantation, the electrostatic discharge device being a different device type from the high-power device and the electrostatic discharge device having a different structure from the high-power device.

11 Claims, 10 Drawing Sheets

FABRICATING ESD DEVICES USING MOSFET AND LDMOS

FIELD OF THE INVENTION

The present invention relates to the field of semiconductor devices; more specifically, it relates to methods of fabricating ESD devices concurrently with and using MOSFET and/or LDMOS ion implantations.

BACKGROUND

Integrated circuits using CMOS technology require ESD protection to prevent catastrophic destruction of the CMOS FETs. However, ESD devices require structures not found in CMOS circuits and thus require dedicated processes, which add time and cost to CMOS integrated circuits. Accordingly, there exists a need in the art to eliminate the deficiencies and limitations described hereinabove.

SUMMARY

An aspect of the present invention is a method, comprising; simultaneously forming a first doped region of an electrostatic discharge protection device and a second doped region of a high-power device by performing a first ion implantation into a semiconductor substrate; and simultaneously forming a third doped region of the electrostatic discharge protection device and a fourth doped region of a first low power device by performing a second ion implantation into the semiconductor substrate, the first ion implantation different from the second ion implantation, the electrostatic discharge device being a different device type from the high-power device and the electrostatic discharge device having a different structure from the high-power device.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

Doped (or diffused) regions of semiconductor substrates (e.g., silicon) are formed by ion implantation of a dopant species (e.g., phosphorus, arsenic, boron) into a semiconductor body followed by annealing (e.g., to at least several hundred degrees centigrade) to activate the dopant species. Often a patterned photoresist layers are used to define which regions of an integrated circuit chip will receive a particular ion implantation.

The embodiments of the present invention use ion implantations used to fabricate CMOS (complementary metal-oxide-silicon) FET (field effect transistor) and/or ion implantations used to fabricate LDMOS (lateral double diffused field effect transistor) to simultaneously fabricate ESD (electrostatic discharge) protection devices. ESD protection devices include ESD diodes and ESD shunt devices where all three types of devices, CMOS FETs, LDMOS and diodes and/or shunt devices are fabricated on the same integrated circuit chip. CMOS devices include P-channel FETs (PFETs) and n-channel FETs (NFETs). An LDMOS is a high-power (IV) device compared to an NFET or PFET used in CMOS logic, which may be considered low-power devices. LDMOS has a higher source to drain breakdown voltages, can carry higher currents and can operate at higher voltage levels than CMOS logic PFETs and NFETs. The CMOS logic PFETs and NFETs, LDMOS, and ESD diodes and/or ESD shunt devices are fabricated in the same substrate and utilize a same dielectric trench isolation.

High-power devices (also known as high-voltage, high-power or high-voltage power devices) operate at a voltage greater than a low-power device. High-power device applications operate at, for example, 120 V, 50 V, 45 V, 25 V, 20 V, 20 V, 12 V, and 5V. LDMOS are high power-devices. LDMOS are used in both the linear and saturated regime for power applications. LDMOS can operate, for example, at 120 V, 45 V, 25 V, 20 V, and 15 V. LDMOS also find use the lower voltage range between 6.5 to 3.3 V. In one example, a high-power device operates at a voltage about 5 volts or greater and low-power device operates at a voltage of about 1.8 volts or less. In high-voltage applications, electrical overstress (EOS) and ESD are important considerations. Additionally, since LDMOS are fabricated for use in a low-voltage CMOS technology, latchup is also a significant concern. Latchup can occur due to interaction between the LDMOS and the low voltage CMOS PFETs and NFETs which are integrated on the same semiconductor chip. As a result, solutions to provide EOS and ESD robustness and latchup insensitivity is desired.

Figure 1:
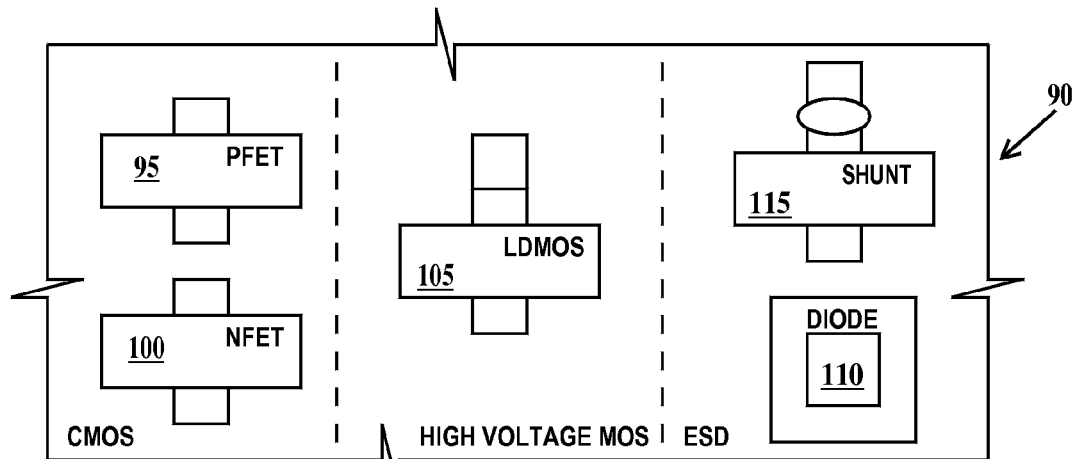
FIG. 1 is a pictorial top view of an integrated circuit including CMOS FETs, LDMOSs and ESD devices according to embodiments of the present invention.

FIG. 1 is a pictorial top view of an integrated circuit including CMOS FETs, LDMOSs and ESD devices according to embodiments of the present invention. In FIG. 1, an integrated circuit chip includes an exemplary PFET and an exemplary NFET, an LDMOS 105, an ESD diode 110 and/or an ESD shunt device 115. Both ESD diode 110 and ESD shunt device 115 need not be present. While only one PFET 95, one NFET 100, one LDMOS 105, one ESD diode 110 and one ESD shunt device 115 are illustrated in FIG. 1, there may be multiple instances of each type of device. In one example, PFETs 95 and NFETs 105 may be wired to form CMOS logic circuits. In one example, LDMOS 105 may be included in power supply circuits. In one example, ESD diodes 110 may be included in ESD protection circuits. In one example, ESD shunt devices 115 may be included in ESD protection circuits. In one example, combinations of ESD diodes 110 and ESD shunt devices 115 may be included in ESD protection circuits.

Figure 2:
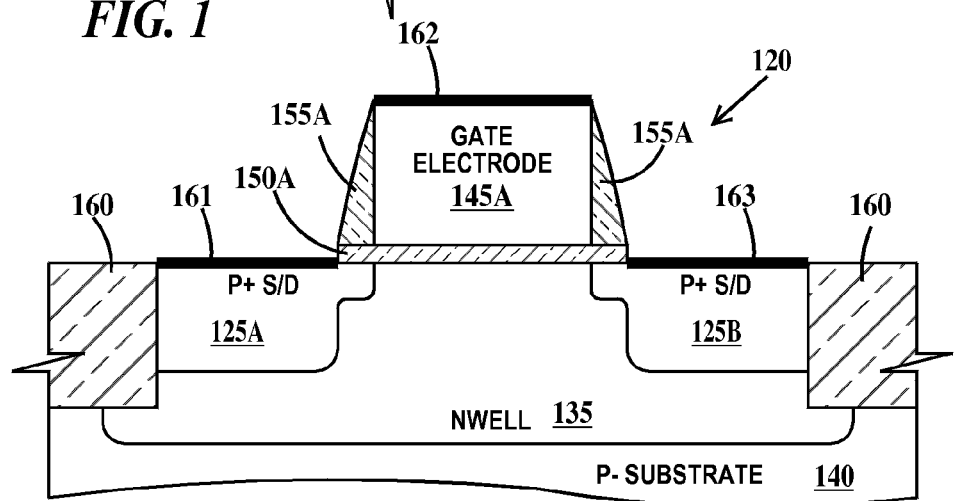
FIG. 2 is a cross-sectional view through an exemplary PFET according to embodiments of the present invention.

FIG. 2 is a cross-sectional view through an exemplary PFET according to embodiments of the present invention. In FIG. 2, a PFET 120 includes source/drains (S/Ds) 125A and 125B formed in an N-well 135 formed in a substrate 140. Substrate 140 is doped P-type. A gate electrode 145A is separated from source/drains 125A and 125B and N-well 135 by a gate dielectric 150A. Optional dielectric sidewall spacers 155A are form on the sidewalls of gate electrode 145A. PFET 120 is electrically isolated by dielectric trench isolation 160. A metal silicide layer 161 is formed on a top surface of source/drain 125A. A metal silicide layer 162 is formed on a top surface gate electrode 145A. A metal silicide layer 163 is formed on a top surface of source/drain 125B. In one example, substrate 140 is, single-crystal silicon. In one example, substrate 140 is p-doped. In one example gate electrode 145A is polysilicon. Source/drains 125A and 125B are formed by a P-type source/drain (P S/D) ion implantation which is a P-type ion implantation. N-well 135 is formed by an N-well ion implantation, which is an N-type ion implantation.

Figure 3:
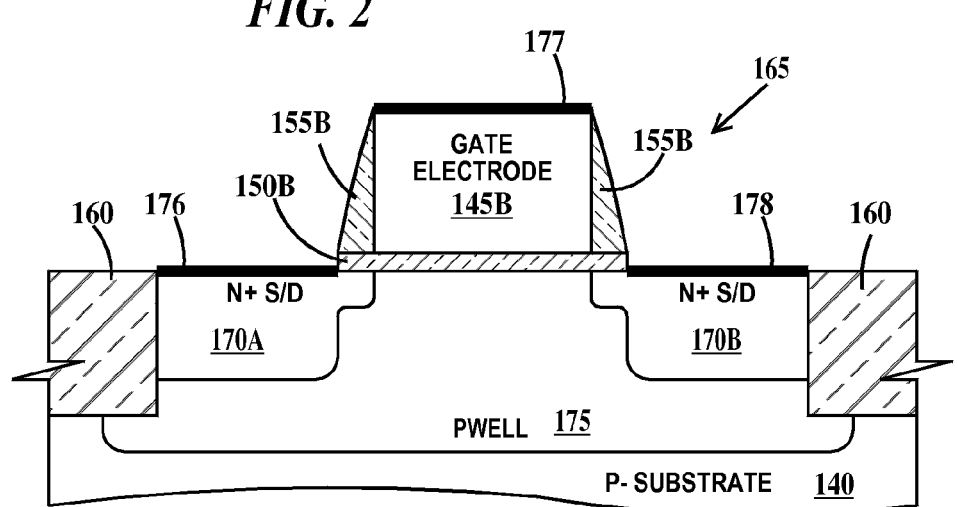
FIG. 3 is a cross-sectional view through an exemplary NFET according to embodiments of the present invention.

FIG. 3 is a cross-sectional view through an exemplary NFET according to embodiments of the present invention. In FIG. 3, an NFET 165 includes source/drains 170A and 170B formed in a P-well 175 formed in substrate 140. A gate electrode 145B is separated from source/drains 170A and 170B and P-well 175 by a gate dielectric 150B. Optional dielectric sidewall spacers 155B are form on the sidewalls of gate electrode 145B. NFET 165 is electrically isolated by dielectric trench isolation 160. A metal silicide layer 176 is formed on a top surface of source/drain 170A. A metal silicide layer 177 is formed on a top surface gate electrode 145B. A metal silicide layer 178 is formed on a top surface of source/drain 170B. In one example gate electrode 145B is polysilicon. Source/drains 170A and 170B are formed by a N-type source/drain (N-S/D) ion implantation which is an N-type ion implantation. P-well 175 is formed by a P-well ion implantation, which is a P-type ion implantation.

Typically, when FETs are fabricated, the N-well and P-well ion implantations are performed first followed by the source/drain ion implantations. An exemplary ion implantation order for CMOS device fabrication would be N-well ion implantation, P-well ion implantation, N S/D ion implantation, P S/D ion implantation.

Figure 4:
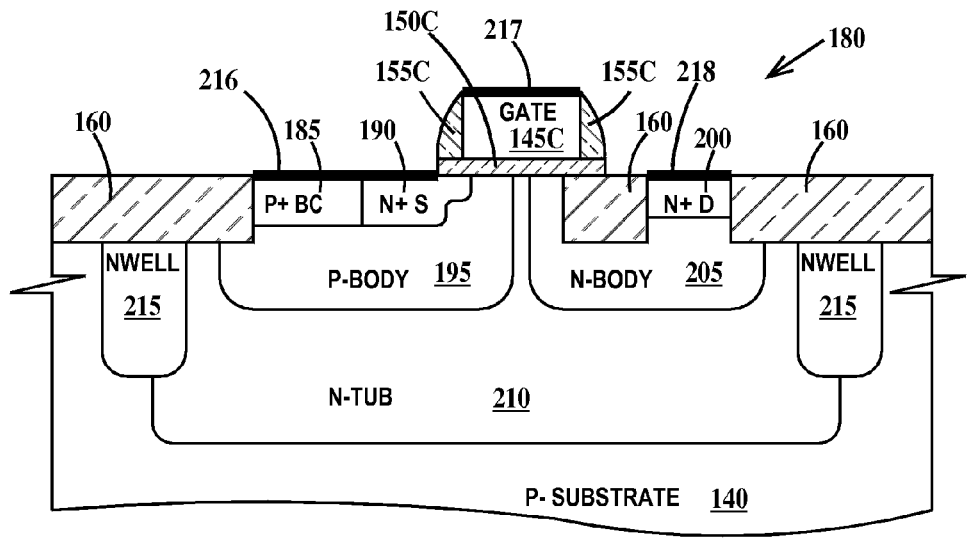
FIG. 4 is a cross-sectional view through an exemplary first type of LDMOS according to embodiments of the present invention.

FIG. 4 is a cross-sectional view through an exemplary first type of LDMOS according to embodiments of the present invention. In FIG. 4, a LDMOS 180 includes a P-type body contact (P+BC) 185 and an N-type source (N+S) 190 formed in and contained in a P-body 195 and an N-type drain (N+D) 200 formed in and contained in an N-body 205. N-tub 210 is formed in substrate 140. P-body 195 and B-body 205 are formed in an N-tub 210, which is bounded by an N-well 215 and trench isolation 160. P-body 195 and N-body 205 extend under a gate electrode 145C. A region of N-tub 210 intervenes between P-body 195 and N-body 205 under gate electrode 145C. N-type source 190 intervenes between P-type body contact 185 and a region of P-body 195 that extends under gate electrode 145C. Gate electrode 145C is separated from N-type source 190, P-body 195, N-tub 210 and N-body 205 by a gate dielectric 150C. P-type body contact 185 and N-type drain 200 do not extend under gate electrode 145C. A region of dielectric trench isolation surrounds the sidewalls of N-type drain 200. A metal silicide layer 216 is formed on top surfaces of P-type body contact 185 and N-type source 190. A metal silicide layer 217 is formed on a top surface of gate electrode 145C. A metal silicide layer 218 is formed on a top surface of N-type drain 200.

P-type body contact 185 is formed by the P S/D ion implantation. N-type source 190 and N-type drain 200 are formed by the N S/D ion implantation. N-well 215 is formed by the N-well ion implantation. P-body 195 is formed by a P-body ion implantation, which is a P-type ion implantation. N-body 205 is formed by a N-body ion implantation, which is an N-type ion implantation. N-tub 210 is formed by a N-tub ion implantation, which is an N-type ion implantation. An exemplary ion implantation order for LDMOS 180 would be N-tub ion implantation, N-well ion implantation, P-well ion implantation, N-body ion implantation, P-body ion implantation, N S/D ion implantation, P S/D ion implantation. Thus, the fabrication of LDMOS 180 utilizes the N-well, N S/D and P S/D ion implantations used to fabricate NFETs and PFETs.

Figure 5:
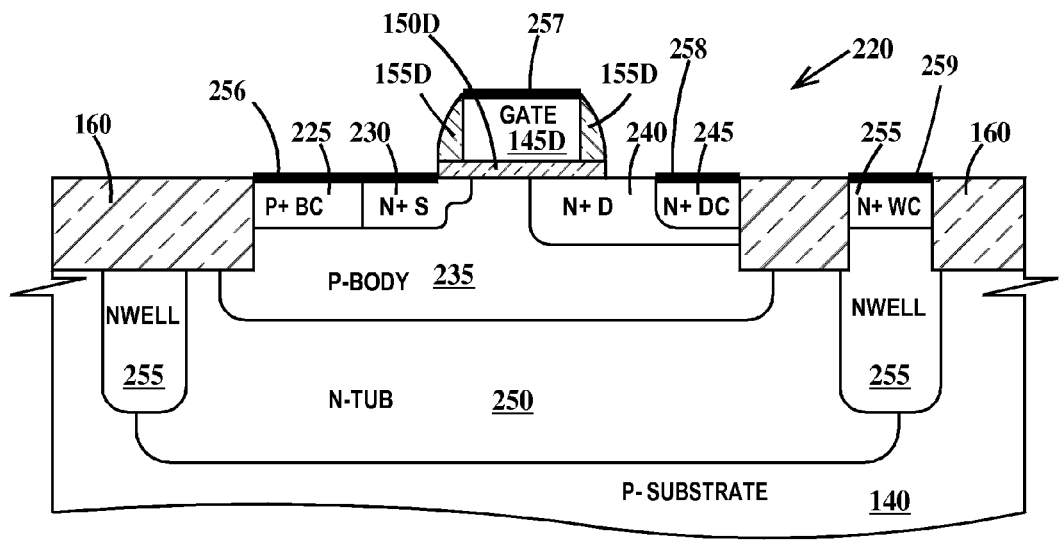
FIG. 5 is a cross-sectional view through an exemplary second type of LDMOS according to embodiments of the present invention.

FIG. 5 is a cross-sectional view through an exemplary second type of LDMOS according to embodiments of the present invention. In FIG. 5, a LDMOS 220 includes a P-type body contact 225 and an N-type source 230 formed in and contained in a P-body 235. LDMOS 220 also includes an N-type drain contact 245 formed in and contained in an N-type drain 240. N-type drain 240 is also formed in and contained in P-body 235. P-body 235 is formed in an N-tub 250, which is bounded, by an N-well 255 and trench isolation 160. N-type source 230 and N-type drain 240 extend under a gate electrode 145D. A region of P-body 235 intervenes between N-type source 230 and N-type drain 240 under gate electrode 145D. Gate electrode 145D is separated from N-type source 230, P-body 235 and N-type drain 240 by a gate dielectric 150D. P-type body contact 185 and N-type drain contact 245 do not extend under gate electrode 145D. A metal silicide layer 256 is formed on top surfaces of P-type body contact 225 and N-type source 230. A metal silicide layer 257 is formed on a top surface of gate electrode 145D. A metal silicide layer 258 is formed on a top surface of N-type drain contact 245.

P-type body contact 225 is formed by the P S/D ion implantation. N-type source 230 and N-type drain contact 245 are formed by the N S/D ion implantation. N-well 255 is formed by the N-well ion implantation. P-body 235 is formed by the P-body ion implantation. N-tub 210 is formed by the N-tub ion implantation. N-type drain is formed by a second N-type source (SN) ion implantation, which is an N-type ion implantation. An exemplary ion implantation order for LDMOS 220 would be N-tub, N-well, P-well, N-body, SN, N S/D, P S/D. Thus, the fabrication of LDMOS 220 utilizes the N-well, N S/D and P S/D ion implantations used to fabricate NFETs and PFETs.

Eight ion implants have been described. An overall exemplary ion implantation order would be N-tub, N-well, P-well, N-body, P-body, SN, N S/D, P S/D wherein the order of N-well and P-well may be reversed, the order of N S/D and P S/D may be reversed, and the order of N-body and P-body may be reversed. It should be understood, that when any of each of these eight ion implantations is performed, the ion implantation is performed only once during fabrication of an integrated circuit and the same ion implantation is used to form different "diffusions" or doped semiconductor regions of PFETs, NFETs, LDMOSs, ESD diode and ESD shunt device simultaneously. However, as will be seen, not all ESD diodes or ESD shunt devices require all eight of these ion implantations. Each of the N-tub, N-well, P-well, N-body, P-body, SN, N S/D and P S/D ion implantations extend from the top surface of the substrate into the substrate, so some regions actually see more than on ion implantations. For example, in FIG. 5, P-body 235 includes N-type dopant from the N-tub ion implantation and P-type dopant from the P-body ion implantation, but the net doping is P-type. The boundaries illustrated in the drawings are PN junction or differences in concentration between regions of the same doping concentration. It should also be realized that the doping concentration is not necessarily uniform through any particular doped region but may vary with distance from the top surface of the substrate.

In one example, the eight ion implantations in order of decreasing ion implantation dose (atm/cm$^2$) (or decreasing concentration (atm/cm$^3$) in the substrate) is N S/D and P S/D, SN, N-well and P-well, N-body and P-body, and N-tub wherein N-well and P-well may be ion implanted at different doses, N S/D and P S/D may be ion implanted at different doses, and N-body and P-body may be ion implanted at different doses. In one example, the eight ion implantations in order of increasing energy (KeV) or increasing depth into the substrate) is N S/D and P S/D, SN, N-body and P-body, N-well and P-well, N-tub wherein N-well and P-well may be ion implanted at different energies, N S/D and P S/D may be may be ion implanted at different energies, and the order of N-body and P-body may be ion implanted at different energies. In one example, N-well, P-well, P-body, N-body and N-tub ion implantations are performed prior to formation dielectric trench isolation and P S/D, N S/D and SN ion implantations are performed after formation of dielectric trench isolation.

In one example, the ESD diodes and ESD shunt devices described infra are fabricated using one or more of these eight ion implantations. In one example, the ESD diodes and ESD shunt devices described infra are fabricated using four or more of these eight ion implantations and no other ion implantations. In one example, the ESD diodes and ESD shunt devices described infra, are fabricated using at least one ion implantation used to fabricate PFETs or NFETs and at least one ion implantation used to fabricate LDMOSs.

Figure 6:
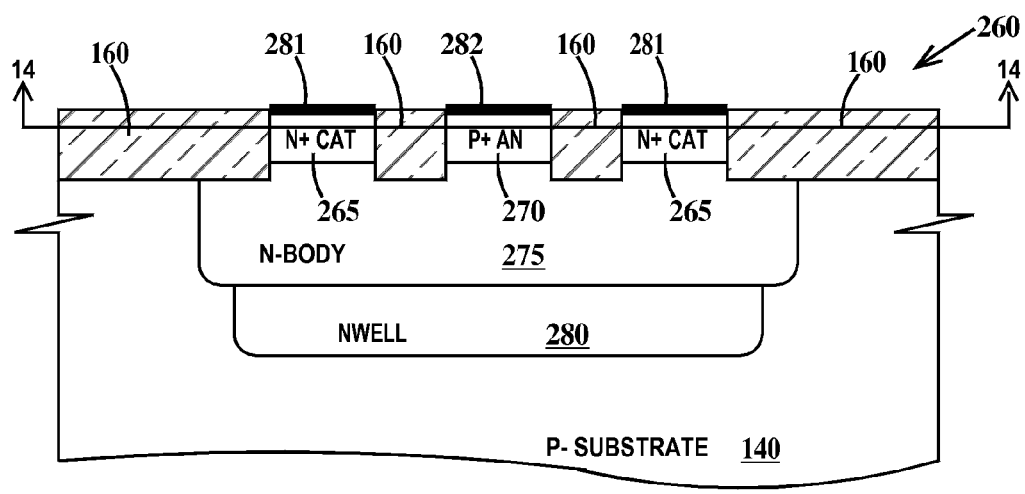
FIG. 6 is a cross-sectional view through an exemplary first type of ESD diode according to embodiments of the present invention.

FIG. 6 is a cross-sectional view through an exemplary first type of ESD diode according to embodiments of the present invention. In FIG. 6, an ESD diode 260 includes an N-type cathode 265 and a P-type anode 270 in an N-body 275. N-body 275 is formed in substrate 140. N-type cathode 265 is separated from P-type anode 270 by dielectric trench isolation 160. An N-well 280 extends from the bottom of N-body 275 into substrate 140. A metal silicide layer 281 is formed on a top surface of N-type cathode 265 and a metal silicide layer 282 is formed on a top surface of P-type anode 270. N-type cathode 265 is formed by the third (N S/D) ion implantation. P-type anode 270 is formed by the first (P S/D) ion implantation. N-body 275 is formed by the sixth (N-body) ion implantation. N-well 280 is formed by the second (N-well) ion implantation. Thus, the fabrication of ESD diode 260 utilizes the N-well, N S/D and P S/D ion implantations used to fabricate NFETs and PFETs and the N-body ion implantation used to fabricate LDMOSs.

Figure 7:
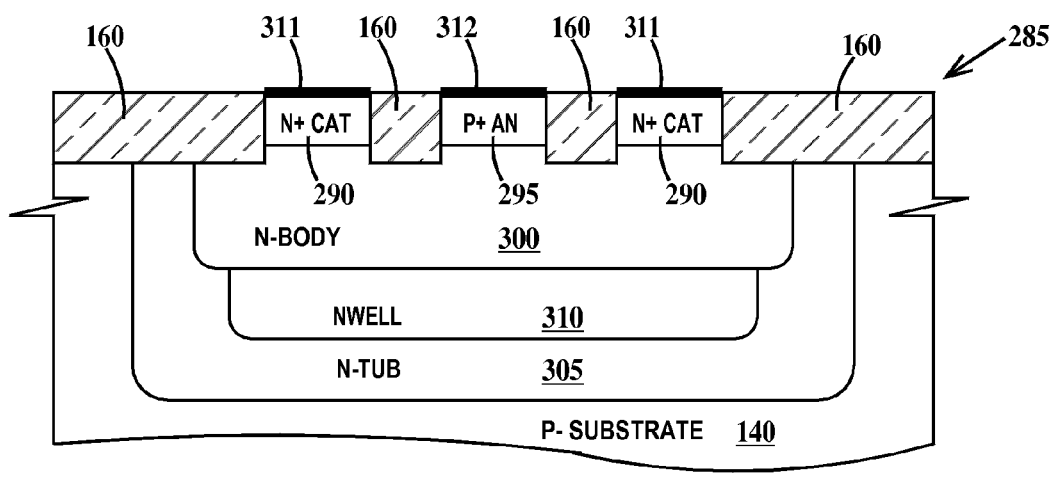
FIG. 7 is a cross-sectional view through a exemplary second type of ESD diode according to embodiments of the present invention.

FIG. 7 is a cross-sectional view through an exemplary second type of ESD diode according to embodiments of the present invention. In FIG. 7, an ESD diode 285 includes an N-type cathode 290 and a P-type anode 295 in an N-body 300. N-type cathode 290 is separated from P-type anode 295 by dielectric trench isolation 160. N-body 300 is formed in an N-tub 310, which is formed in substrate 140. An N-well 310 extends from the bottom of N-body 300 into N-tub 305, but not past the bottom of the N-tub. A metal silicide layer 311 is formed on a top surface of N-type cathode 290 and a metal silicide layer 312 is formed on a top surface of P-type anode 295. N-type cathode 290 is formed by the N S/D ion implantation. P-type anode 295 is formed by the P S/D ion implantation. N-body 300 is formed by the N-body ion implantation. N-well 310 is formed by the N-well ion implantation. N-tub 305 is formed by the N-tub ion implantation. Thus, the fabrication of ESD diode 285 utilizes the N-well, N S/D and P S/D ion implantations used to fabricate NFETs and PFETs and the N-body and N-tub ion implantations used to fabricate LDMOSs.

Figure 8:
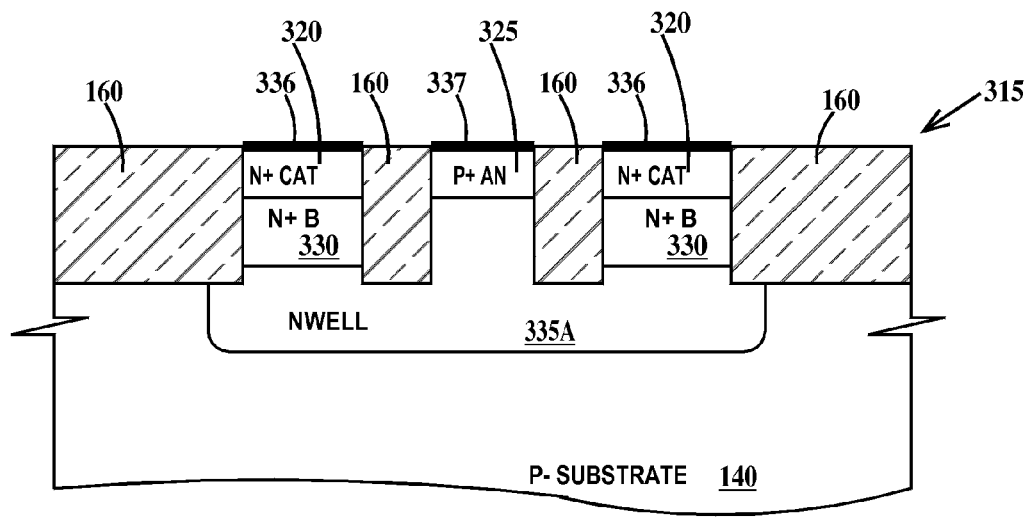
FIG. 8 is a cross-sectional view through a exemplary third type of ESD diode according to embodiments of the present invention.

FIG. 8 is a cross-sectional view through an exemplary third type of ESD diode according to embodiments of the present invention. In FIG. 8, an ESD diode 315 includes an N-type cathode 320 and a P-type anode 325 in an N-well 335A. N-well 335A is formed in substrate 140. An N-type buried region 330 is formed between N-type cathode 320 and N-well 335A. N-type cathode 320 and N-type buried region 330 are separated from P-type anode 325 by dielectric trench isolation 160. A metal silicide layer 336 is formed on a top surface of N-type cathode 320 and a metal silicide layer 337 is formed on a top surface of P-type anode 325. N-type cathode 320 is formed by the third (N S/D) ion implantation. P-type anode 325 is formed by the P S/D ion implantation. N-well 335A is formed by the N-well ion implantation. N-type buried region 330 is formed by the SN ion implantation. Thus, the fabrication of ESD diode 315 utilizes the N-well, N S/D and P S/D ion implantations used to fabricate NFETs and PFETs and the SN ion implantation used to fabricate LDMOSs.

Figure 9:
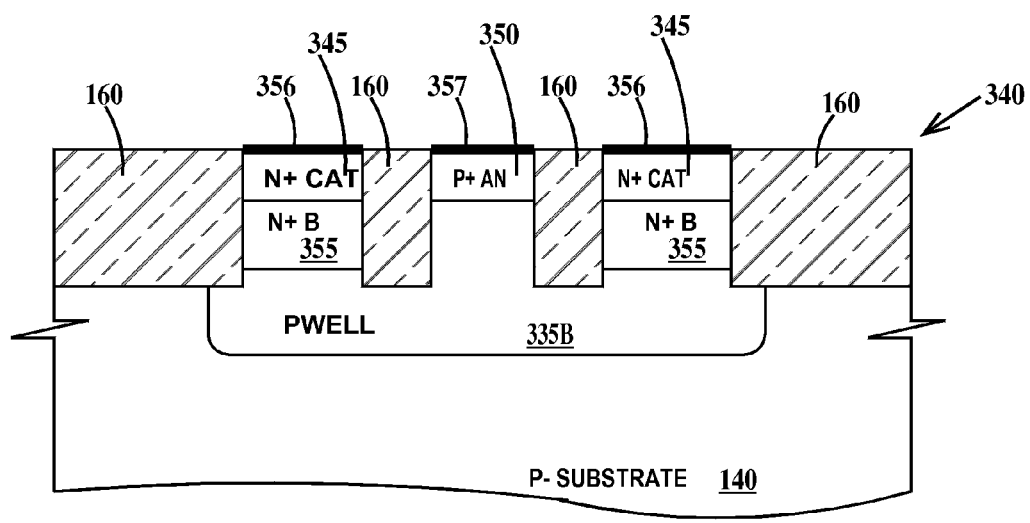
FIG. 9 is a cross-sectional view through an exemplary fourth type of ESD diode according to embodiments of the present invention.

FIG. 9 is a cross-sectional view through an exemplary fourth type of ESD diode according to embodiments of the present invention. In FIG. 9, an ESD diode 340 includes an N-type cathode 345 and a P-type anode 350 in an N-well 335B. N-well 335B is formed in substrate 140. An N-type buried region 355 is formed between N-type cathode 345 and N-well 335B. N-type cathode 345 and N-type buried region 355 are separated from P-type anode 350 by dielectric trench isolation 160. A metal silicide layer 356 is formed on a top surface of N-type cathode 355 and a metal silicide layer 357 is formed on a top surface of P-type anode 350. N-type cathode 345 is formed by the N S/D ion implantation. P-type anode 350 is formed by the first (P S/D) ion implantation. P-well 335B is formed by the P-well ion implantation. N-type buried region 355 is formed by the SN ion implantation. Thus, the fabrication of ESD diode 340 utilizes the P-well, N S/D and P S/D ion implantations used to fabricate NFETs and PFETs and the SN ion implantation used to fabricate LDMOSs.

Figure 10:
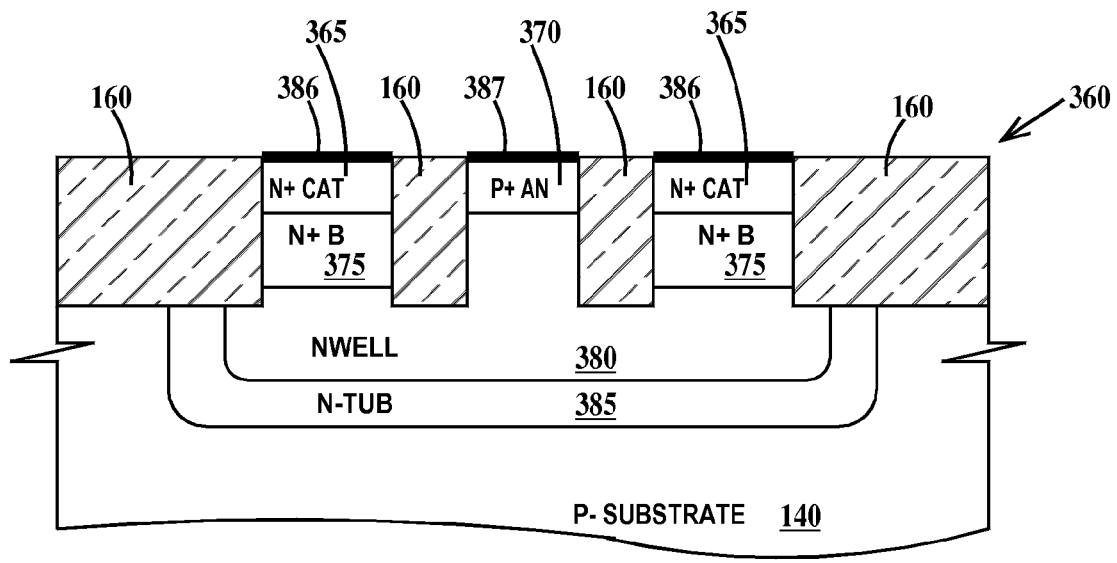
FIG. 10 is a cross-sectional view through an exemplary fifth type of ESD diode according to embodiments of the present invention.

FIG. 10 is a cross-sectional view through an exemplary fifth type of ESD diode according to embodiments of the present invention. In FIG. 10, an ESD diode 360 includes an N-type cathode 365 and a P-type anode 370 in an N-well 380. N-well 380 is formed in an N-tub 380, which is formed in substrate 140. An N-type buried region 375 is formed between N-type cathode 365 and N-well 380. N-type cathode 365 and N-type buried region 375 are separated from P-type anode 380 by dielectric trench isolation 160. A metal silicide layer 386 is formed on a top surface of N-type cathode 365 and a metal silicide layer 387 is formed on a top surface of P-type anode 370. N-type cathode 365 is formed by the N S/D ion implantation. P-type anode 380 is formed by the P S/D ion implantation. N-well 380 is formed by the N-well ion implantation. N-type buried region 375 is formed by the SN ion implantation. N-tub 385 is formed by the N-tub ion implantation. Thus, the fabrication of ESD diode 360 utilizes the N-well, N S/D and P S/D ion implantations used to fabricate NFETs and PFETs and the SN and N-tub ion implantations used to fabricate LDMOSs.

Figure 11:
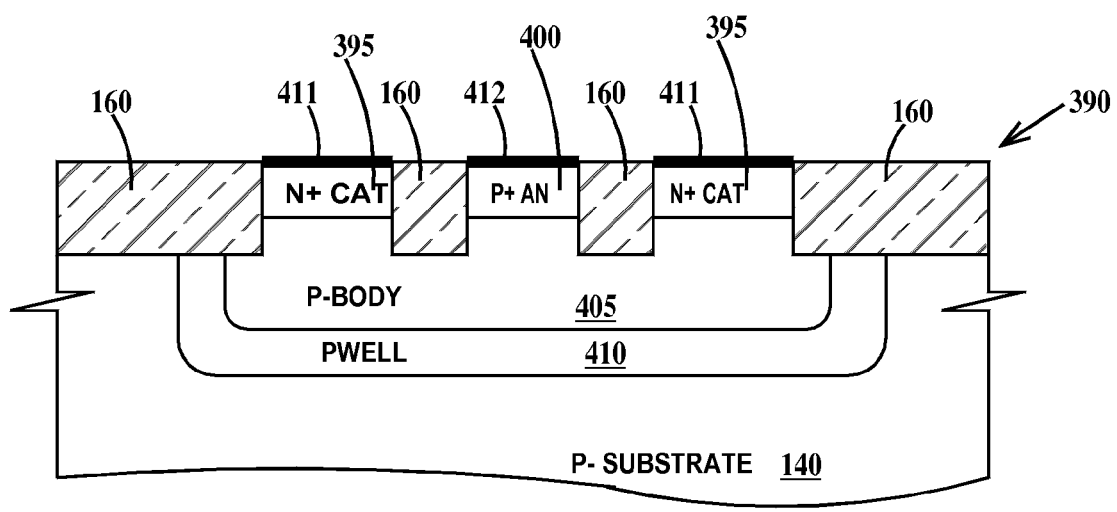
FIG. 11 is a cross-sectional view through an exemplary sixth type of ESD diode according to embodiments of the present invention.

FIG. 11 is a cross-sectional view through an exemplary sixth type of ESD diode according to embodiments of the present invention. In FIG. 11, an ESD diode 390 includes an N-type cathode 395 and a P-type anode 400 in a P-body 405. N-type cathode 395 is separated from P-type anode 400 by dielectric trench isolation 160. P-body 405 is formed in a P-well 410, which is formed in substrate 140. A metal silicide layer 411 is formed on a top surface of N-type cathode 395 and a metal silicide layer 412 is formed on a top surface of P-type anode 400. N-type cathode 395 is formed by the third (N S/D) ion implantation. P-type anode 400 is formed by the P S/D ion implantation. P-body 300 is formed by the P-body ion implantation. P-well 410 is formed by the P-well ion implantation. Thus, the fabrication of ESD diode 390 utilizes the P-well, N S/D and P S/D ion implantations used to fabricate NFETs and PFETs and the P-body ion implantation used to fabricate LDMOSs.

Figure 12:
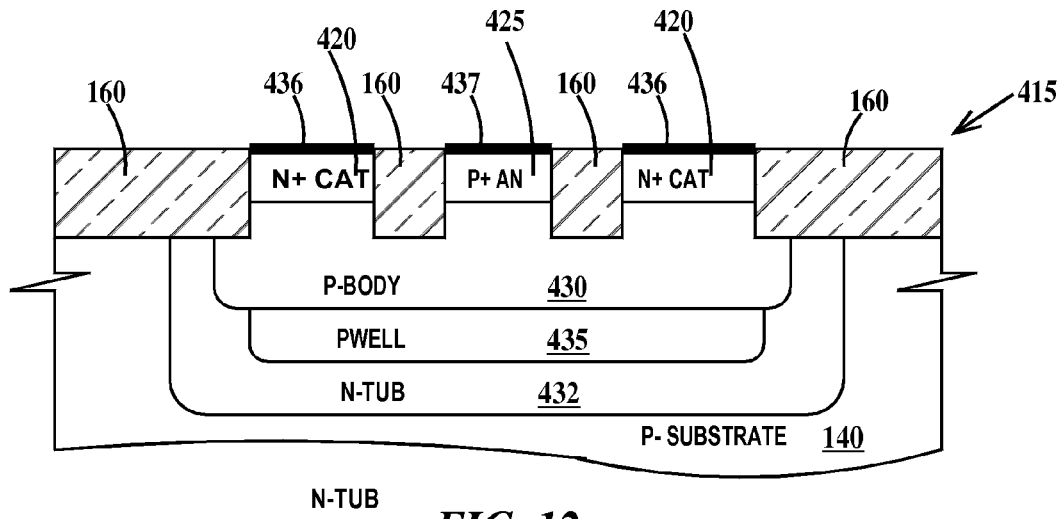
FIG. 12 is a cross-sectional view through an exemplary seventh type of ESD diode according to embodiments of the present invention.

FIG. 12 is a cross-sectional view through an exemplary seventh type of ESD diode according to embodiments of the present invention. In FIG. 12, an ESD diode 415 includes an N-type cathode 420 and a P-type anode 425 in a P-body 430. An N-type buried region 445 is formed between N-type cathode 445 and P-body 460. N-type cathode 420 and N-type buried region 455 are separated from P-type anode 425 by dielectric trench isolation 160. P-body 430 is formed in an N-tub 432, which is formed in substrate 140. A P-well 435 extends from the bottom of P-body 430 into N-tub 432 but not past a bottom of the N-tub. A metal silicide layer 436 is formed on a top surface of N-type cathode 420 and a metal silicide layer 437 is formed on a top surface of P-type anode 425. N-type cathode 420 is formed by the N S/D ion implantation. P-type anode 425 is formed by the P S/D ion implantation. P-body 430 is formed by the P-body ion implantation. P-well 435 is formed by the P-well ion implantation. N-tub 432 is formed by the N-tub ion implantation. Thus, the fabrication of ESD diode 415 utilizes the P-well, N S/D and P S/D ion implantations used to fabricate NFETs and PFETs and the P-body and N-tub ion implantations used to fabricate LDMOSs.

Figure 13:
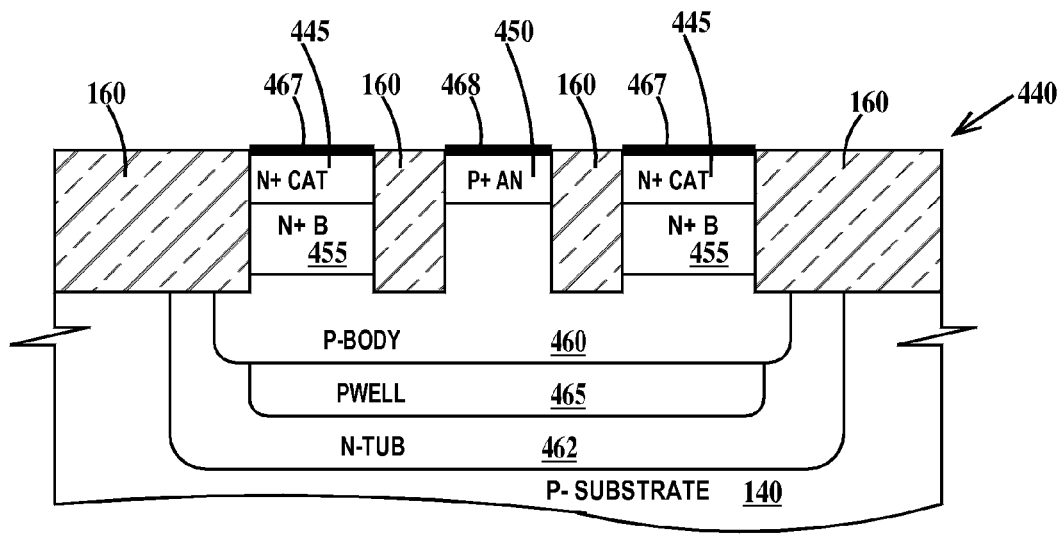
FIG. 13 is a cross-sectional view through an exemplary eighth type of ESD diode according to embodiments of the present invention.

FIG. 13 is a cross-sectional view through an exemplary eighth type of ESD diode according to embodiments of the present invention. In FIG. 13, an ESD diode 440 includes an N-type cathode 445 and a P-type anode 450 in a P-body 460. A N-type buried region 455 intervenes between N-type cathode 445 and P-body 460. N-type cathode 445 and buried N-type region 455 are separated from P-type anode 450 by dielectric trench isolation 160. P-body 460 is formed in an N-tub 462, which is formed in substrate 140. A P-well 465 extends from the bottom of P-body 460 into N-tub 462 but not past a bottom of the N-tub. A metal silicide layer 467 is formed on a top surface of N-type cathode 445 and a metal silicide layer 468 is formed on a top surface of P-type anode 450. N-type cathode 445 is formed by the N S/D ion implantation. P-type anode 450 is formed by the P S/D ion implantation. P-body 460 is formed by the P-body ion implantation. P-well 465 is formed by the P-well ion implantation. N-tub 462 is formed by the N-tub ion implantation. Buried region 455 is formed by the SN ion implantation. Thus, the fabrication of ESD diode 440 utilizes the P-well, N S/D and P S/D ion implantations used to fabricate NFETs and PFETs and the P-body, N-tub ion and SN ion implantations used to fabricate LDMOSs.

Figure 14:
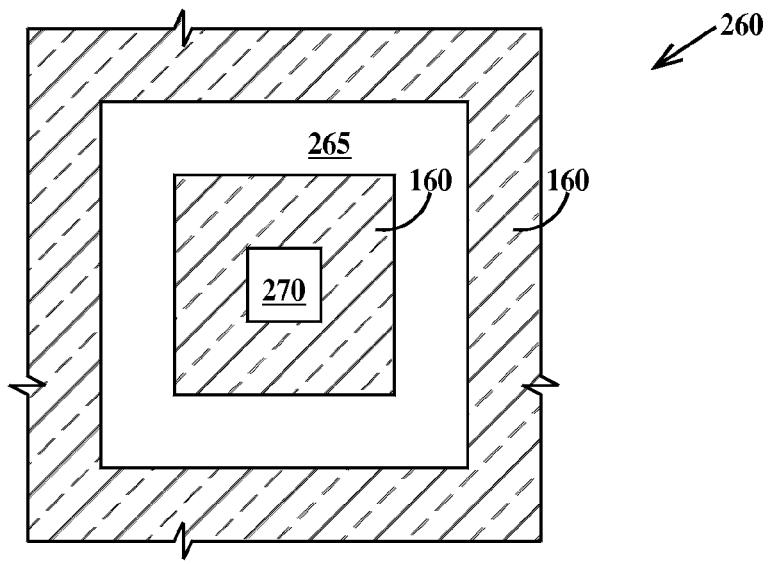
FIG. 14 is a top view through line 14-14 of FIG. 6.

FIG. 14 is a top view through line 14-14 of FIG. 6. In FIG. 14, it can be seen that ESD diode 260 comprises a ring shaped N-type cathode 265 surrounding a perimeter of P-type cathode 270 with a ring of trench dielectric isolation 160 intervening between N-type cathode 265 and P-type anode 270. This ring-shaped diode structure is exemplary of all seven of the ESD diodes described supra. However, the ESD diodes of the embodiments of the present invention are not limited to this particular geometric layout and other layers layouts such as a stripe of anode between two stripes of cathode may also be used.

Figure 15:
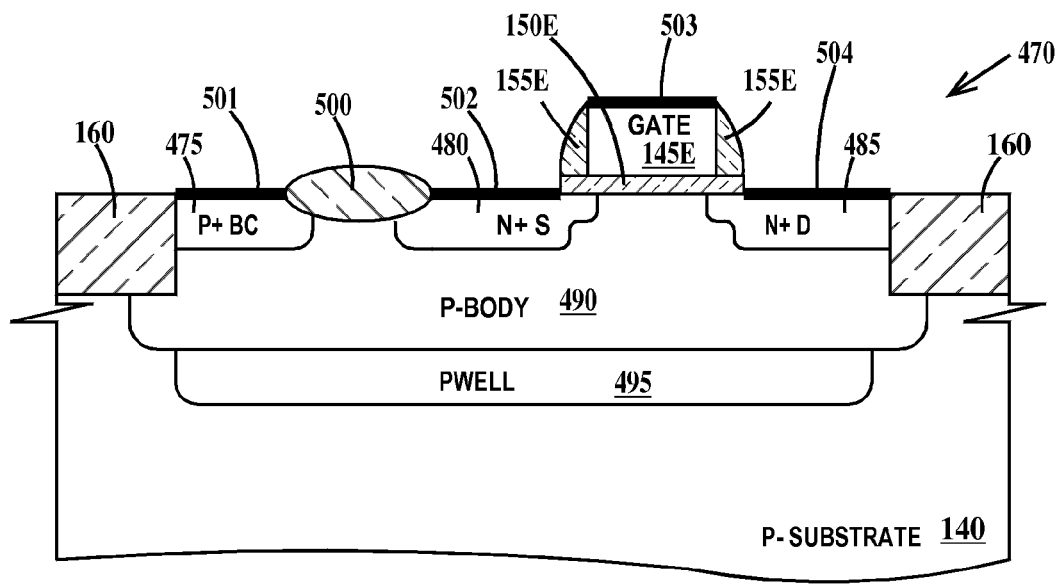
FIG. 15 is a cross-sectional view through an exemplary first type of ESD shunt device according to embodiments of the present invention.

FIG. 15 is a cross-sectional view through an exemplary first type of ESD shunt device according to embodiments of the present invention. ESD shunt devices according to embodiments of the present inventions are a type of FET. In FIG. 15, an ESD shunt device 470 includes a P-type body contact 475, an N-type source 480 and an N-type drain 485 formed in substrate 140. A P-well 495 extends from a bottom of P-body 490 into substrate 140. N-type source 480 and N-type drain 485 extend under a gate electrode 145E. A region of P-body 490 intervenes between N-type source 480 and N-type drain 485 under gate electrode 145E. Gate electrode 145E is separated from N-type source 480, P-body 490 and N-type drain 485 by a gate dielectric 150E. P-type body contact 475 is isolated from N-type source 480 by a region of locally oxidized silicon (LOCOS) 500. A metal silicide layer 501 is formed on top surfaces of P-type body contact 475. A metal silicide layer 502 is formed on a top surface of N-type source 480. A metal silicide layer 503 is formed on a top surface of gate electrode 145E. A metal silicide layer 504 is formed on a top surface of N-type drain 485.

P-type body contact 475 is formed by the P S/D ion implantation. N-type source 480 and N-type drain 485 are formed by the N S/D ion implantation. P-well 490 is formed by the P-well ion implantation. P-body 495 is formed by the P-body ion implantation. Thus, the fabrication of ESD shunt device 470 utilizes the P-well, N S/D and P S/D ion implantations used to fabricate NFETs and PFETs and the P-body ion implantation used to fabricate LDMOSs.

Figure 16:
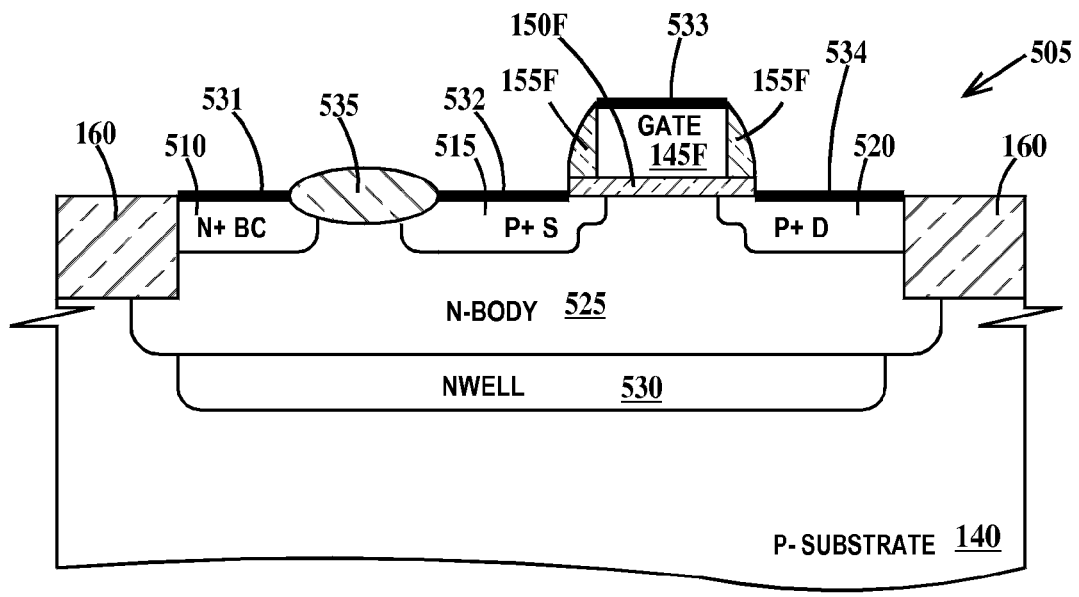
FIG. 16 is a cross-sectional view through an exemplary second type of ESD shunt device according to embodiments of the present invention.

FIG. 16 is a cross-sectional view through an exemplary second type of ESD shunt device according to embodiments of the present invention. In FIG. 16, an ESD shunt device 505 includes an N-type body contact 510, a P-type source 515 and a P-type drain 520 formed in and contained in an N-body 525. N-body 525 is formed in a substrate 140. A region of N-well 530 extends from a bottom of N-body 525 into substrate 530. P-type source 515 and P-type drain 520 extend under a gate electrode 145F. A region of N-body 525 intervenes between P-type source 515 and P-type drain 520 under gate electrode 145F. Gate electrode 145F is separated from P-type source 515, N-body 525 and P-type drain 520 by a gate dielectric 150F. N-type body contact 510 is isolated from P-type source 515 by a region of LOCOS 535. A metal silicide layer 531 is formed on top surfaces of N-type body contact 510. A metal silicide layer 532 is formed on a top surface of P-type source 515. A metal silicide layer 533 is formed on a top surface of gate electrode 145F. A metal silicide layer 534 is formed on a top surface of P-type drain 520.

N-type body contact 510 is formed by the N S/D ion implantation. P-type source 515 and P-type drain 520 are formed by the P S/D ion implantation. N-well 530 is formed by the N-well ion implantation. N-body 525 is formed by the N-body ion implantation. Thus, the fabrication of ESD shunt device 505 utilizes the N-well, N S/D and P S/D ion implantations used to fabricate NFETs and PFETs and the N-body ion implantation used to fabricate LDMOSs.

Figure 17:
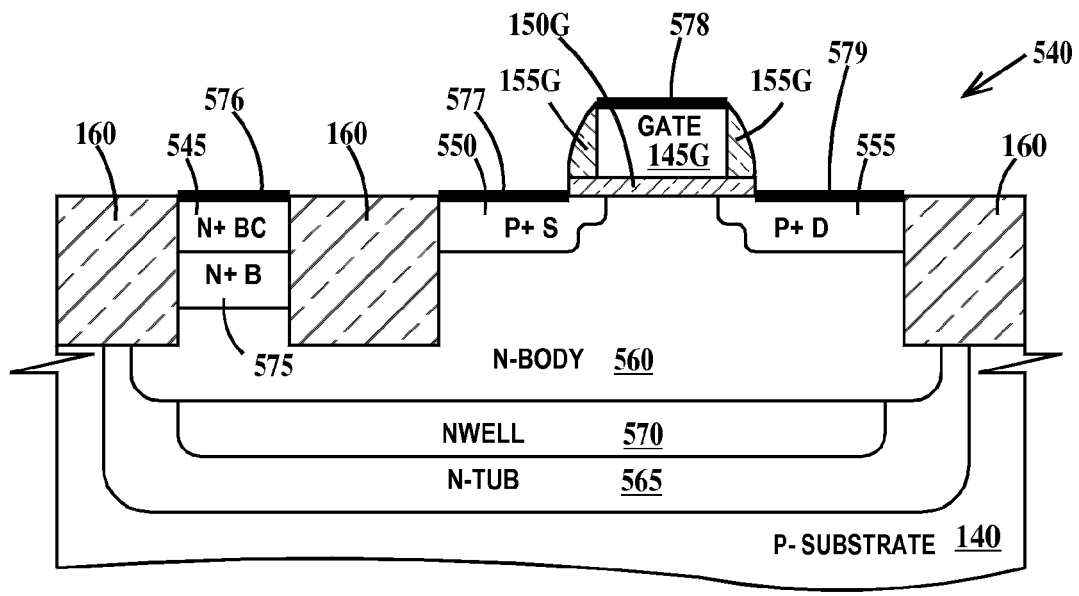
FIG. 17 is a cross-sectional view through an exemplary third type of ESD shunt device according to embodiments of the present invention.

FIG. 17 is a cross-sectional view through an exemplary third type of ESD shunt device according to embodiments of the present invention. In FIG. 17, an ESD shunt device 540 includes an N-type body contact 545, a P-type source 550 and a P-type drain 555 formed in and contained in an N-body 560. N-body 560 is formed in and contained in an N-tub 565 formed in substrate 140. A region of N-well 570 extends from a bottom of N-body 560 into N-tub 565 but not past a bottom of the N-tub. P-type source 550 and P-type drain 555 extend under a gate electrode 145G. A region of N-body 560 intervenes between P-type source 550 and P-type drain 555 under gate electrode 145G. Gate electrode 145G is separated from P-type source 550, N-body 560 and P-type drain 555 by a gate dielectric 150G. A buried N-type region 575 intervenes between N-type body contact 545 and N-body 560. N-type body contact 545 and buried N-type region 575 are isolated from P-type source 550 by a region of dielectric trench isolation 160. A metal silicide layer 576 is formed on top surfaces of N-type body contact 545. A metal silicide layer 577 is formed on a top surface of P-type source 550. A metal silicide layer 578 is formed on a top surface of gate electrode 145G. A metal silicide layer 579 is formed on a top surface of P-type drain 555.

N-type body contact 545 is formed by the N S/D ion implantation. P-type source 550 and P-type drain 555 are formed by the P S/D ion implantation. N-well 570 is formed by the N-well ion implantation. N-body 560 is formed by the N-body ion implantation. N-tub 565 is formed by the N-tub ion implantation. Buried N-type region 575 is formed by the SN ion implantation. Thus, the fabrication of ESD shunt device 540 utilizes the N-well, N S/D and P S/D ion implantations used to fabricate NFETs and PFETs and the N-body, N-tub and SN ion implantations used to fabricate LDMOSs.

Table I summarizes the ion implantation steps used to fabricate CMOS FETS, LDMOSs and ESD diodes and ESD shunt devices according to embodiments of the present invention described supra.

TABLE I

| I/I | CMOS FET I/I Processes | | | | LDMOS I/I Processes | | | |
|---|---|---|---|---|---|---|---|---|
| | P S/D | N S/D | N-Well | P-Well | N-Body | SN | P-Body | N-Tub |
| PFET | X | | X | | | | | |
| NFET | | X | | X | | | | |
| LDMOS #1 | X | X | X | | X | | X | X |
| LDMOS #2 | X | X | X | | | X | X | x |
| ESD DIODE #1 | X | X | X | | X | | | |
| ESD DIODE #2 | X | X | X | | X | | | X |
| ESD DIODE #3 | X | X | X | | | X | | |
| ESD DIODE #4 | X | X | | X | | X | | |
| ESD DIODE #5 | X | X | X | | | X | | X |
| ESD DIODE #6 | X | X | | X | | | X | |
| ESD DIODE #7 | X | X | | X | | | X | X |
| ESD DIODE #8 | X | X | | X | | X | X | X |
| ESD SHUNT #1 | X | X | | X | | | X | |
| ESD SHUNT #2 | X | X | X | | X | | | |
| ESD SHUNT #3 | X | X | X | | X | X | | |

Figure 18:
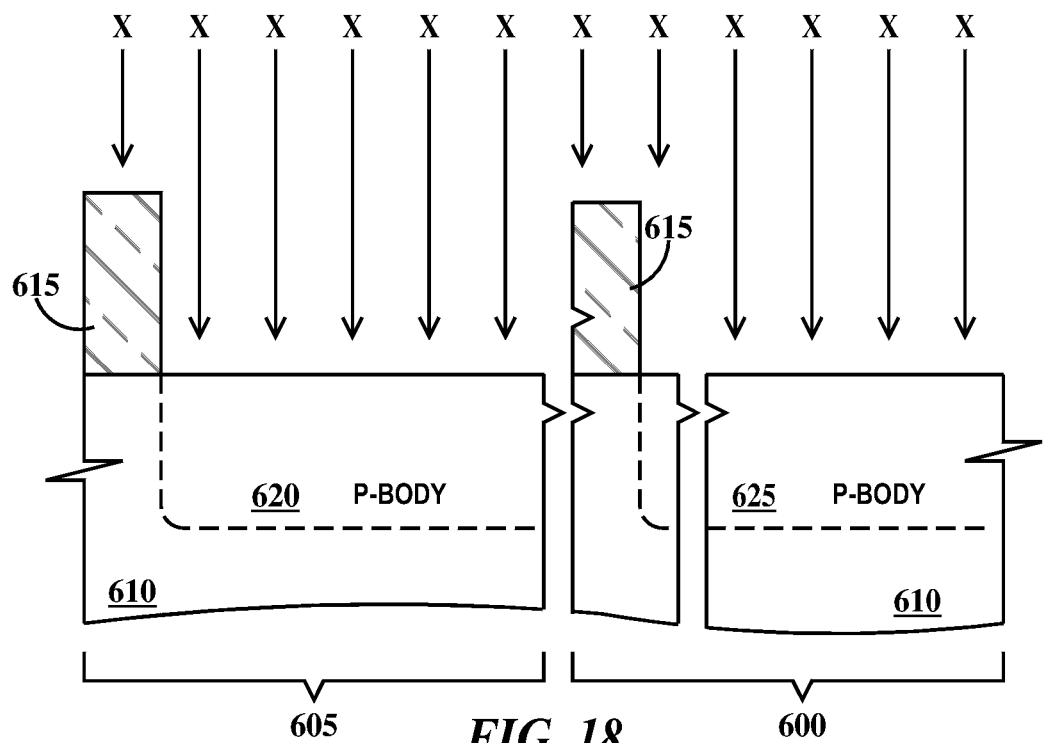
FIG. 18 is a cross-sectional view through an exemplary LDMOS and an exemplary ESD diode during a first simultaneous ion implantation step according to embodiments of the present invention.

FIG. 18 is a cross-sectional view through an exemplary LDMOS and an exemplary ESD diode during a first simultaneous ion implantation step according to embodiments of the present invention. In FIG. 18, an ESD diode 600 and LDMOS 605 are being fabricated in a substrate 610. A patterned photoresist layer 615 has been form on substrate 610 and an ion implant of dopant species X performed to form a P-body in LDMOS 605 and an P-body 625 in ESD diode 600. Photoresist layer 615 is removed after the ion implantation. Dopant species X is a P-type dopant (e.g., boron). Alternatively, patterned photoresist layer 615 may be formed on a dielectric hardmask layer and not directly on the top surface of substrate 610.

Figure 19:
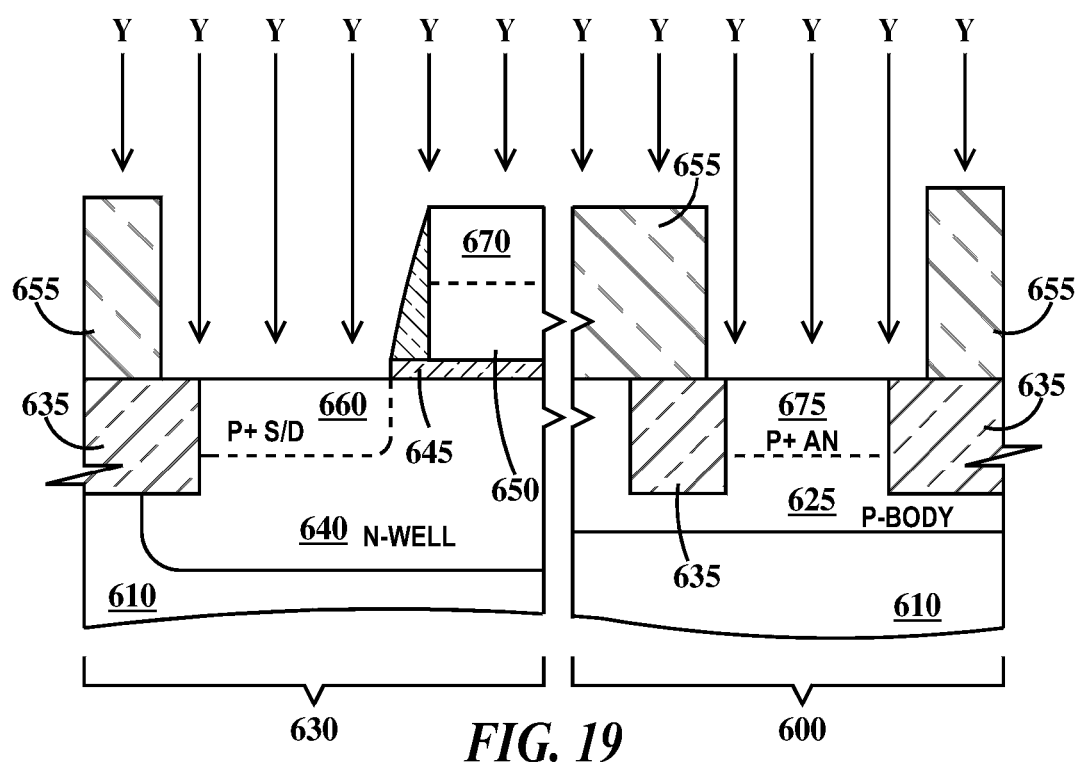
FIG. 19 is a cross-sectional view through an exemplary PFET and the exemplary ESD diode of FIG. 18 during a second simultaneous ion implantation step according to embodiments of the present invention.

FIG. 19 is a cross-sectional view through an exemplary PFET and the exemplary ESD diode of FIG. 18 during a first simultaneous ion implantation step according to embodiments of the present invention. In FIG. 19, a PFET 630 and ESD diode 605 during fabrication are shown. In FIG. 19, dielectric trench isolation 635 has been formed in both PFET 630 and ESD diode 605. A gate dielectric 645 and gate electrode 650 have been formed in PFET 630. A patterned photoresist layer 655 is formed over substrate 610 and an ion implant of dopant species Y performed to form a P-type source/drain in PFET 630, a doped gate region 670 in gate electrode 650, and a P-type anode 675 in ESD diode 600. Photoresist layer 655 is removed after the ion implantation. Dopant species Y is a P-type dopant (e.g., boron).

Figure 20:
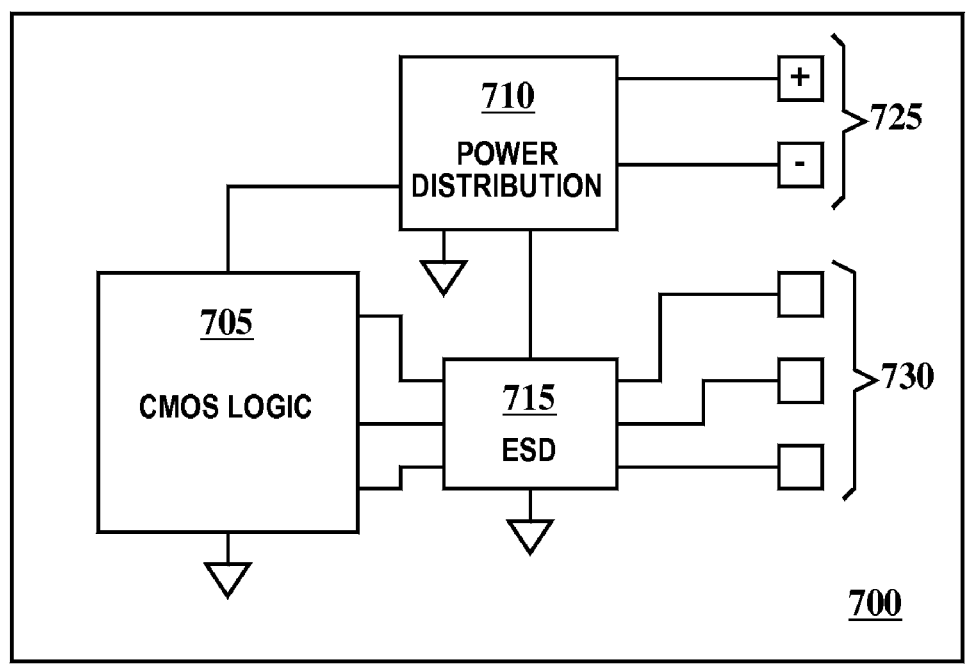
FIG. 20 is a schematic circuit diagram of an exemplary integrated circuit using PFETS, NFETS, LDMOSs and ESD diodes and/or ESD shunt devices according to embodiments of the present invention.

FIG. 20 is a schematic circuit diagram of an exemplary integrated circuit using PFETS, NFETS, LDMOSs and ESD diodes and/or ESD shunt devices according to embodiments of the present invention. In FIG. 20, an integrated circuit chip 700 includes CMOS logic 705 comprising PFETs and NFETs, a power distribution network 710 comprising LDMOSs (used for example, as switches, voltage regulators and/or DC to DC converters) and an ESD protection circuit 715 comprising ESD diodes and/or ESD shunt devices. Power distribution network is connected to power supply pads 725 and distributes power to CMOS logic 705 and ESD protection circuit 715. ESD protection circuit 715 is connected between CMOS logic 705 and I/O pads 730. The ESD diodes and/or ESD shunt devices (i) share at least one ion implantation process with either the PFETs or NFETs or (ii) share at least one ion implantation process with the LDMOSs or (iii) share at least one ion implantation process with either the PFETs or NFETs and share at least one ion implantation process with the LDMOSs.

Thus the embodiments of the present invention provide a method for fabricating ESD devices simultaneously with LDMOSs and CMOS FETs using LDMOS and MOSFET ion implantations and without the use of dedicated ion implantations for the ESD devices.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising;
    simultaneously forming a first doped region of an electrostatic discharge protection device and a second doped region of a high-power device by performing a first ion implantation into a semiconductor substrate;
    simultaneously forming a third doped region of said electrostatic discharge protection device and a fourth doped region of a first low-power device by performing a second ion implantation into said semiconductor substrate, said first ion implantation different from said second ion implantation, said electrostatic discharge device being a different device type from said high-power device and said electrostatic discharge device having a different structure from said high-power device;
    simultaneously forming a fifth doped region of said electrostatic discharge protection device and a sixth doped region of a second low-power device by performing a third ion implantation into said semiconductor substrate, said third ion implantation different from said first, and second ion implantations;
    said first low-power device is a CMOS logic PFET, said second low-power device is a CMOS logic NFET, said high-power device is a lateral double diffused field effect transistor, and said electrostatic protection device is a shunt transistor; and
    said first doped region is a P-well of said shunt transistor, said second doped region is a P-well of said lateral double diffused field effect transistor, said third doped region is a P-body contact of said shunt transistor, said fourth doped region is a source/drain of said CMOS logic PFET, said fifth doped region is a source/drain of said shunt transistor, and said sixth doped region is a source/drain of said CMOS logic NFET.

2. The method of claim 1, wherein all ion implantations used to form said electrostatic protection device are ion implantations selected from the group of ion implantations consisting of ion implantations used to form doped regions of CMOS logic PFETs and NFETs in said semiconductor substrate and ion implantations used to form doped regions of said high-power device in said semiconductor substrate.

3. The method of claim 1, wherein three ion implantations are used to form respective doped regions of said electrostatic protection device are the same ion implantations used to form respective doped regions of CMOS logic PFETs and NFETs and at least additional one ion implantation used to form an additional doped region of said electrostatic protection device is a same ion implantation used to form a doped region of said high-power device.

4. The method of claim 1, further including:
    forming dielectric trench isolations in said semiconductor substrate, said dielectric trench isolation abutting said low-power device, said high-power device and said electrostatic discharge protection device.

5. The method of claim 1, further including:
    connecting said low-power device, said high-power device and said electrostatic discharge protection device into an integrated circuit.

6. The method of claim 1, wherein said first ion implantation is selected from the group consisting of P-type source/drain ion implantations, N-type source/drain ion implantations, P-well ion implantations and N-well ion implantations used to fabricate CMOS logic field effect transistors and said second ion implantation is selected from the group consisting of N-body ion implantations, P-body ion implantations, N-tub ion implantations and second N-type source ion-implantations, one or more of which are used to fabricate lateral double diffused field effect transistors, said P-type source/drain ion implantations, N-type source/drain ion implantations, P-well ion implantations, N-well ion implantations, N-body ion implantations, P-body ion implantations, N-tub ion implantations and second N-type source ion-implantations being different ion implantations.

7. The method of claim 6, wherein the ion implantations in order of decreasing ion implantation dose are said N-type source/drain and said P-type source/drain ion implantations, said second N-type source ion-implantation, said N-well and said P-well ion implantations, said N-body and P-body ion implantations, and said N-tub ion implantation.

8. The method of claim 6, wherein the ion implantations in order of increasing ion implantation energy are said P-type and N-type source/drain ion implantation, said second N-type source ion-implantation, said N-well and said P-well ion implantations, said N-body and P-body ion implantations, and said N-tub ion implantation.

9. The method of claim 1, wherein said first ion implant also forms a P-well of said CMOS logic NFET and said second ion implantation also forms a P-body contact of said shunt transistor.

10. The method of claim 1, wherein said P-body contact of said shunt transistor is isolated from said source/drain of said shunt transistor by dielectric trench isolation.

11. The method of claim 1, wherein said P-body contact of said shunt transistor is isolated from said source/drain of said shunt transistor by a region of locally oxidized silicon (LOCOS).

* * * * *